United States Patent [19]

Kei Lau et al.

[11] Patent Number: 5,382,759
[45] Date of Patent: Jan. 17, 1995

[54] MASSIVE PARALLEL INTERCONNECTION ATTACHMENT USING FLEXIBLE CIRCUIT

[75] Inventors: James C. Kei Lau, Torrance; Richard P. Malmgren, Castaic, both of Calif.; Michael Roush, Farmington Hills, Mich.

[73] Assignee: TRW Inc., Redondo Beach, Calif.

[21] Appl. No.: 127,912

[22] Filed: Sep. 28, 1993

[51] Int. Cl.6 .................................................. H05K 1/02
[52] U.S. Cl. ................................. 174/264; 174/255; 174/261; 174/254; 361/749; 361/778
[58] Field of Search ............... 174/255, 261, 262, 264, 174/265, 254; 361/749, 767, 778; 439/77

[56] References Cited

U.S. PATENT DOCUMENTS

| | | | |
|---|---|---|---|
| 3,718,873 | 2/1973 | Fletcher | 335/152 |
| 3,725,635 | 3/1973 | Smith | 174/68.5 |
| 4,480,288 | 10/1984 | Gazdik et al. | 361/398 |
| 4,513,355 | 4/1985 | Schroeder et al. | 361/403 |
| 4,729,061 | 3/1988 | Brown | 361/386 |
| 4,914,259 | 4/1990 | Kobayashi et al. | 174/255 |
| 5,097,593 | 3/1992 | Jones et al. | 29/852 |
| 5,264,664 | 11/1993 | McAllister et al. | 174/261 |

Primary Examiner—Leo P. Picard
Assistant Examiner—L. Thomas

[57] ABSTRACT

An electrical interconnect and a method of fabricating an electrical interconnect are provided. A first transparent dielectric layer is disposed on top of a support structure. A conductive circuit layer is plated above the first dielectric layer. Separate conductive layers are plated on top of the conductive circuit layer to produce conductive vias. A second transparent dielectric layer is disposed around the conductive layers. Contact tips are electrically connected to the top surface of the separate conductive layers. The interconnect may be visually aligned so that the contact tips brought into contact with target connections. In addition, the support structure may be partially removed to allow a flexible interconnect.

3 Claims, 3 Drawing Sheets

STEP 6

MASSIVE PARALLEL INTERCONNECTION ATTACHMENT USING FLEXIBLE CIRCUIT

BACKGROUND OF THE INVENTION

1. Technical Field

This invention relates generally to electrical interconnect circuitry and, more particularly, to an electrical interconnect attachment for providing multiple parallel electrical interconnections and a method for fabricating the same.

2. Discussion

Semiconductor integrated circuits are generally able to accommodate an extremely large number of electronic devices on a very small wafer or chip. For instance, an integrated circuit (IC) chip may contain hundreds of thousands and possibly millions of electrical components. These electrical components may include inverters and logic gates which are interconnected to form electrical integrated circuits. Advances in circuit design technology are continually allowing for increased density and wafer sizes which in turn lead to a larger number of integrated circuits.

Modern integrated circuit chips are commonly mass assembled and packaged so that the integrated circuits are properly interconnected to provide the desired functions. That is, integrated circuit chips are interconnected among the integrated circuits and are generally further connected to circuitry on other chips or external electrical devices. Electrical interconnections are also commonly employed to allow for electrical testing of the circuitry on a chip or wafer. Interconnection attachment has become a major part of the electronic assembly and packaging of integrated circuits, since the large number of electrical connections that are needed for modern high performance systems can be very time consuming and expensive.

In the past, conventional interconnect attachments have included the use of conductive wires or ribbons bonded or otherwise attached to the electronic devices. However, there has been some difficulty in accommodating high density electronic devices with the use of conventional wire or ribbon bonding leads. In addition, ribbon and wire leads generally tend to provide inflexible connections that are prone to damage, especially when subjected to shock or bending. Today, electronic assembly and packaging systems require electrical interconnection attachments that are strong and reliable. It is also desirable that such interconnection attachments be fabricated in a flexible circuit configuration which is easily producible.

It is therefore desirable to provide for an enhanced electrical interconnection attachment and method for producing the same which is capable of connecting modern and future integrated circuitry. It is also desirable to provide for a method of fabricating flexible electrical interconnects that may easily accommodate high performance systems with enhanced electrical connections. In addition, it is desirable to provide for a compliant interconnect that may be visually guided into contact with target connections. It is further desirable to provide for such an electrical interconnect and fabrication technique for producing the same that is less time consuming and more cost efficient.

SUMMARY OF THE INVENTION

In accordance with the teachings of the present invention, an electrical interconnect and a method of fabricating an electrical interconnect are provided. A first transparent dielectric layer is disposed on top of a support structure. A conductive circuit layer is plated above the first dielectric layer. Separate conductive layers are plated on top of the conductive circuit layer to produce conductive vias. A second transparent dielectric layer is disposed around the conductive circuit layer and vias. In addition, a portion of the support layer is removed from below the conductive circuit layer to allow flexibility. Contact tips are electrically connected to the top surface of the separate conductive layers and may be visually brought into contact with target connections.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 4:
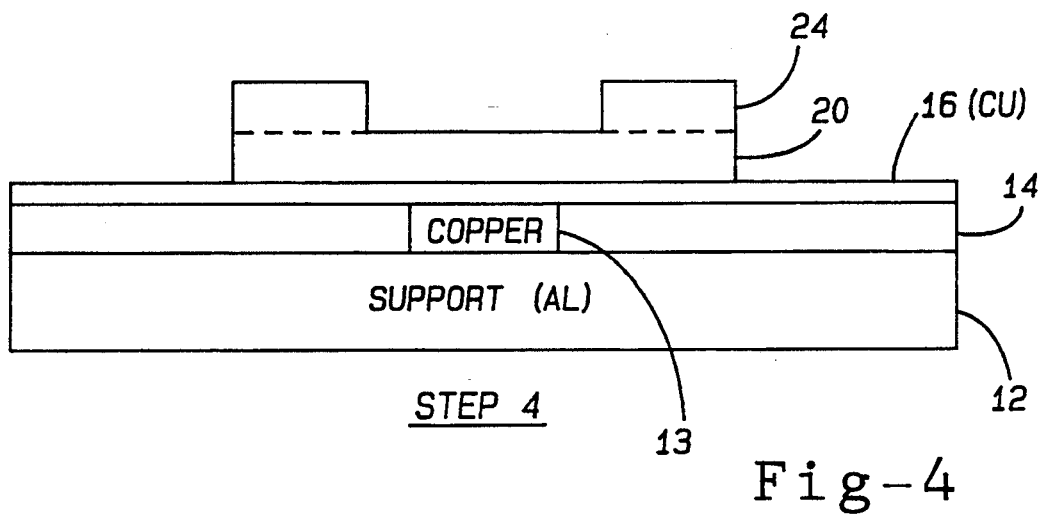
FIG. 4 is a plan view of the circuit configuration which illustrates a fourth step in fabricating the electrical interconnect in accordance with the present invention.
Figure 5:
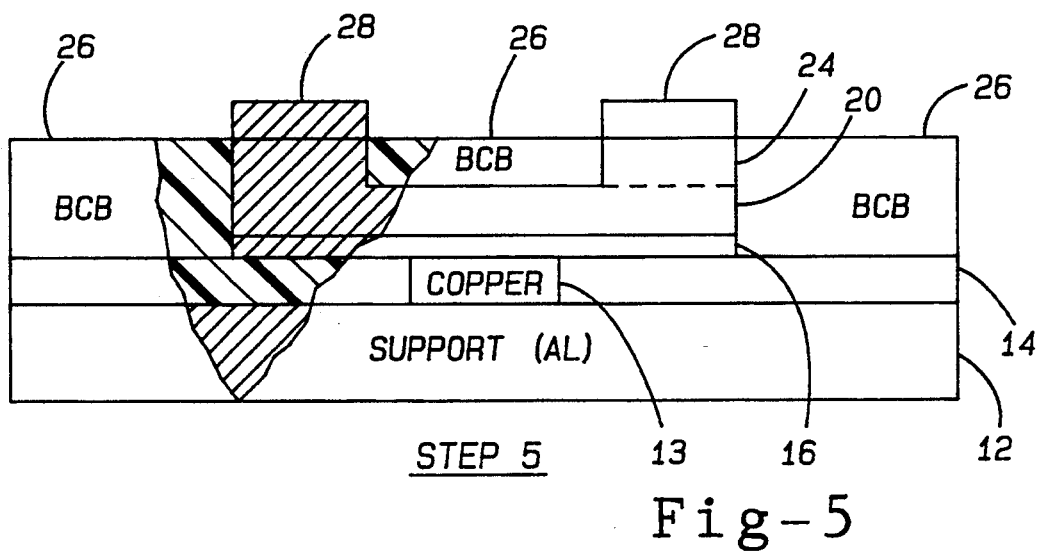
FIG. 5 is a plan view of the circuit configuration with a partial cross-sectional view which illustrates a fifth step in fabricating the electrical interconnect in accordance with the present invention.
Figure 6:
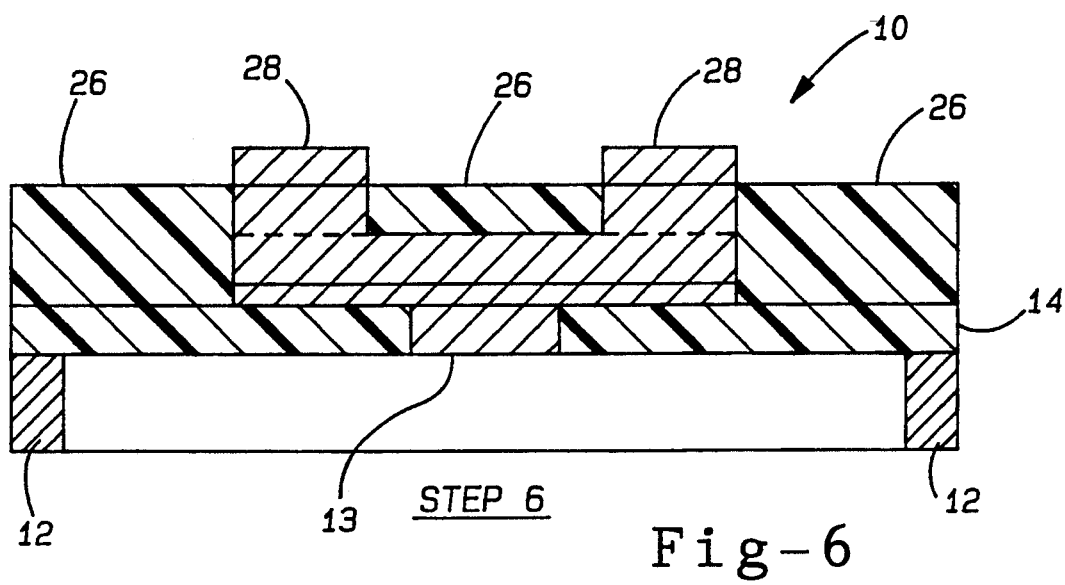
FIG. 6 is a cross-sectional view of the completed electrical interconnect fabricated in accordance with the present invention.
Figure 7:
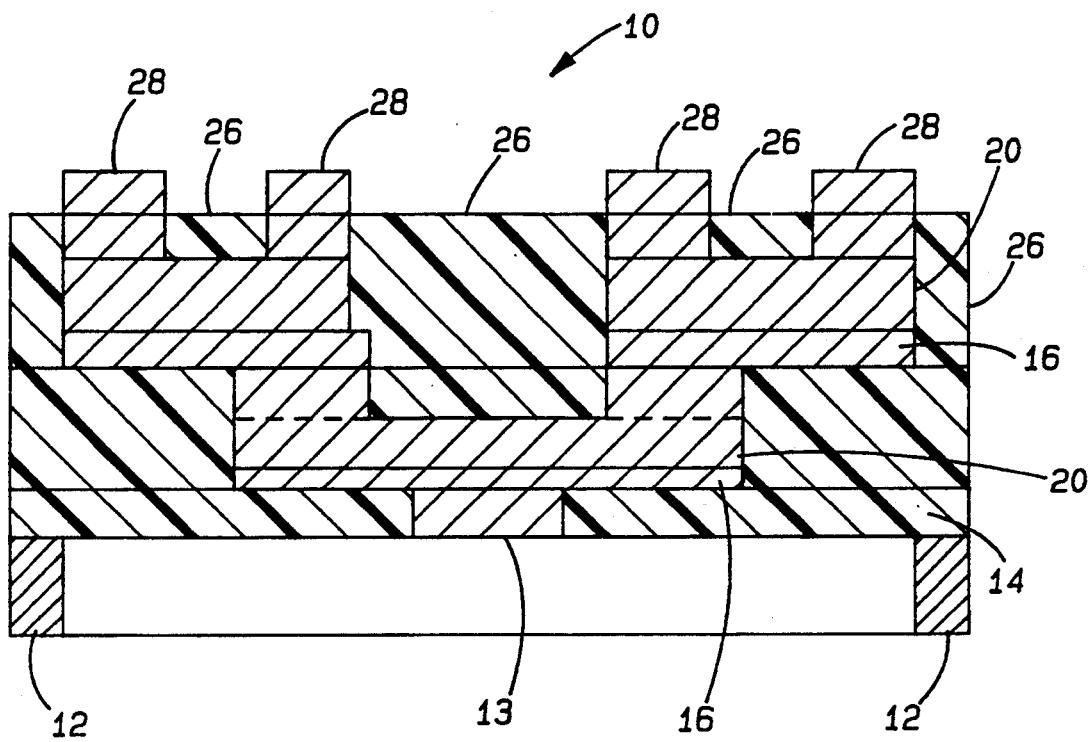
FIG. 7 is a cross-sectional view of a multilayer electrical interconnect fabricated in accordance with the present invention.

Turning now to FIGS. 1 through 6, a method of fabricating an electrical interconnect 10 is illustrated therein according to the present invention. The fabrication method is conveniently shown in accordance with a six-step fabrication process for producing an electrical interconnect 10 that may advantageously be used to provide parallel interconnections among integrated circuits on an IC chip or between circuits on adjacent chips. The fabrication method will be described with particular detail for producing a pair of interconnected contacts as shown in FIG. 6. However, the fabrication process may be repeated in accordance with the teachings of the present invention to provide additional contacts extending through additional interconnected circuit layers as shown in FIG. 7.

Figure 1:
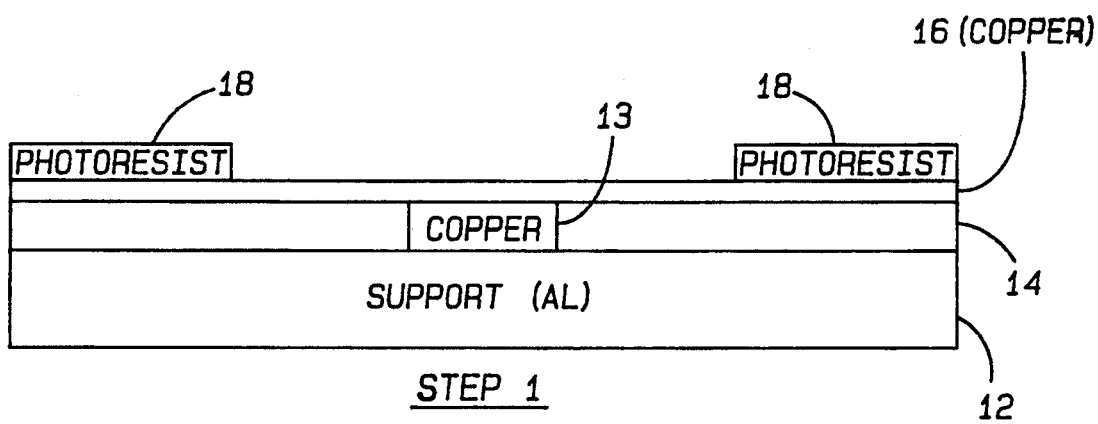
FIG. 1 is a plan view of a circuit configuration which illustrates a first step in fabricating an electrical interconnect in accordance with the present invention.

Beginning with step #1, an aluminum support layer 12 is provided as shown in FIG. 1. A copper pad 13 is connected on the top of support layer 12. Copper pad 13 may be formed in desired circuit configuration. A first transparent dielectric layer of benzocyclobutene (BCB) 14 is disposed on top of the aluminum support layer 12 and surrounding the copper pad 13. Benzocyclobutene is a dielectric material commercially available from Dow Chemical Corp. A thin layer of evaporated copper 16 with a preferred thickness of about 1000 angstroms is disposed over the top surface of the dielectric BCB layer 14. A photoresist material 18 such as AZ4620 which is commercially available from Hoechst is then developed on top of the copper layer 16 and a portion thereof is developed. Photoresist development may be accomplished by using conventional photolithographic techniques which include applying ultraviolet light to a portion of photoresist that is to be removed, while masking the remaining portions thereof.

Support layer 12 provides a stable support structure in which subsequent layers of materials may suitably be formed on top thereof. While support layer 12 is made of aluminum, other rigid materials may be employed in place thereof in addition, a transparent polyimide, Teflon AF or other comparable transparent dielectric material may alternately be employed in place of dielectric layer 14 made up of benzocyclobutene.

Figure 2:
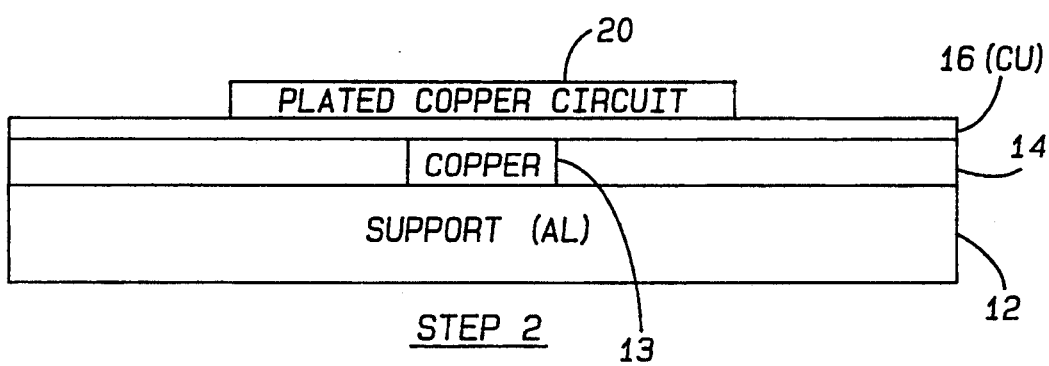
FIG. 2 is a plan view of the circuit configuration which illustrates a second step in fabricating the electrical interconnect in accordance with the present invention.

According to step #2, as shown in FIG. 2, a copper circuit 20 is electroplated within the open regions between the remaining photoresist material 18. The remaining photoresist material 20 is then subsequently removed by conventional stripping techniques so that the plated copper circuit 20 is elevated above the base materials thus far described. The plated copper circuit 20 may be formed into any desired custom made circuit configuration to accommodate the intended interconnection applications.

Figure 3:
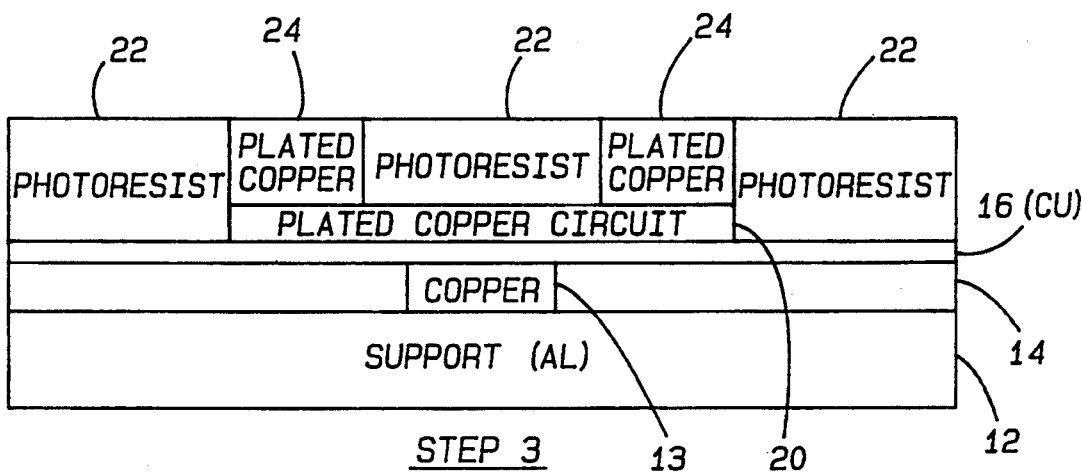
FIG. 3 is a plan view of the circuit configuration which illustrates a third step in fabricating the electrical interconnect in accordance with the present invention.

Next, step #3 in FIG. 3 shows a second layer of photoresist material 22 developed on top of the exposed surface of plated copper circuit 20 and thin copper layer 16. The second layer of photoresist material 22 is developed so that a level surface is formed on top thereof. Using conventional photolithographic techniques, portions of the second layer of photoresist material 22 are removed above plated copper circuit 20 in a manner similar to that described in step #1. Plated copper 24 is then disposed into each of the openings found between remaining photoresist material 22 to provide conductive vias which provide electrical contact with the top surface of plated copper circuit 20.

According to FIG. 4, step #4 includes the removal of the remaining portions of second photoresist layer 22. Photoresist layer 22 may be removed by using stripping techniques such as the type described in step #2. Accordingly, plated copper circuit layer 20 and adjoining plated copper 24 are built up and stacked on top of the thin copper layer 16.

Turning to FIG. 5, step #5 includes the removal of portions of the thin copper layer 16 that are not covered by plated copper circuit 20. This may be accomplished by etching the unwanted portions of thin copper layer 16 from the top surface of first dielectric BCB layer 14. Next, a second transparent dielectric layer of benzocyclobutene (BCB) 26 is disposed on top of the first dielectric BCB layer 14 so that BCB layer 26 substantially surrounds the copper layers 20 and 24. Second dielectric BCB layer 14 may likewise be replaced with an alternate transparent dielectric material such as polyimide. Second dielectric BCB layer 26 is disposed so that a flat top surface is formed that is nearly level with the top surface of copper layers 24. It may also be necessary to buff or grind the top surface of copper layers 24 to provide a good electrical contact surface. Contact tips 28 are then connected to the top surface of copper layers 24 to provide outer extending contacts for directly contacting external conductors. The contact tips 28 preferably are made of a solder plating such as tin/lead or tin/gold plating and have a flat contact surface at the outer end and a short electrical length to allow for enhanced high frequency operations. Contact tips 28 have a preferred physical length of about two rail and a width of about two rail and are expected to be able to efficiently transmit signals with frequencies exceeding 100 GHz.

Finally, FIG. 6 shows the finally step #6 in which the aluminum support layer 12 may be removed from at least the area below the copper pad 13 and copper layers 20 and 24. However, it is preferred that the outermost portions of support layer 12 remain in place to allow a user to handle the interconnect 10 for purposes of installation and removal of interconnect 10. The removal of most of support layer 12 allows the interconnect 10 to achieve flexibility which will allow the contact tips 28 to maintain continuous electric contact despite bending of the compliant circuit arrangement. In addition, a user may visually align interconnect 10 with a desired circuit configuration by viewing the alignment of contact tips 28 with target locations through the transparent dielectric BCB layers 14 and 26.

Furthermore, once the aluminum support layer 12 is removed from below the copper pad 12, external electrical connections may also be provided through the copper pad 12. Such external connections may advantageously enable one to electrically test the interconnect connections or to connect external circuitry onto the bottom side of the interconnect 10.

With particular reference to FIG. 7, the electrical interconnect 10 is shown fabricated into an expanded interconnect that has multiple conductive layers 20 and 24 and dielectric layers 14 and 26 formed repetitively by repeating steps 1 through 5. According to this approach, a number of parallel contact tips 28 may extend from an array of conductive layers 20 and 24 that are formed within a plurality of dielectric layers to provide massive numbers of parallel interconnections. However, it is generally preferred that the dielectric layers 14 and 26 have a thickness of approximately between 0.5 mil to 5 mil. The plated copper circuit layers 20 have a preferred thickness of between 0.25 mil to 0.5 mil, while the copper layer 24 has a preferred thickness of about 0.25 to 4.75 rail.

Figure 8:
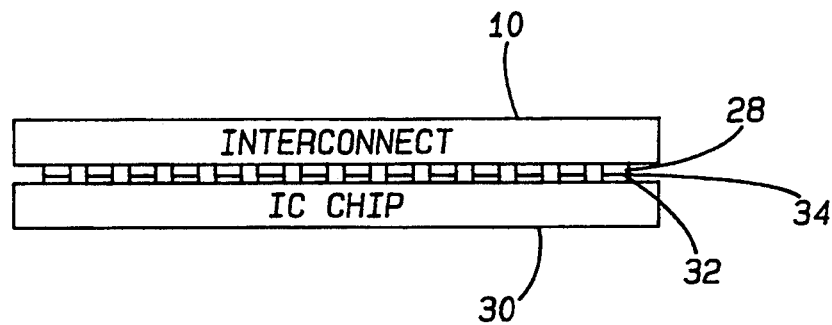
FIG. 8 is a plan view of the electrical interconnect attached to the inboard contact pads of an IC chip.

In operation, electrical interconnect 10 may be employed to provide electric interconnections among integrated circuits on an IC chip 30 as shown in FIG. 8. In doing so, a user visually aligns the contact tips 28 with inboard contact pads 32 on the IC chip 30. Contact tips 28 may forcibly contact 34 inboard contact pads 32 or may be connected thereto via solder, conductive adhesive or other bonding techniques. According to this application, a user may form a desired circuit configuration or may use interconnect 10 to provide for electrical circuitry testing on chip 30.

In view of the foregoing, it can be appreciated that the present invention provides an enhanced electrical interconnect and method of fabricating the same. Thus, while this invention has been disclosed herein in connection with a particular example thereof, no limitation is intended thereby except as defined in the following claims. This is because a skilled practitioner recognizes that other modifications can be made without departing from the spirit of this invention after studying the specification and drawings.

What is claimed is:

1. An electrical interconnect circuit comprising:

a rigid support layer having an open portion removed therefrom;

a first layer of flexible transparent dielectric material disposed on top of said support layer and above said open portion;

a conductive circuit layer formed on top of said first layer of dielectric material;

a conductive pad electrically connected to said conductive circuit layer and extending through said first layer of dielectric material and having an exposed surface within the open portion of said support layer;

a plurality of electroplated conductive vias disposed on top of said conductive circuit layer;

a second layer of flexible transparent dielectric material disposed above said first layer of dielectric material and substantially surrounding the sides of said conductive circuit layer and said conductive vias; and conductive contact tips electrically contacting the top surface of said conductive vias and extending above said second layer of dielectric material to provide electrical contact with external contact points.

2. The interconnect circuit as defined in claim 1 wherein said first and second layers of dielectric material each comprise benzocyclobutene.

3. The interconnect circuit as defined in claim 1 further comprising a thin conductive layer disposed on the bottom surface of said conductive circuit layer.

* * * * *